(12) United States Patent
Hong et al.

(10) Patent No.: US 7,723,240 B2
(45) Date of Patent: May 25, 2010

(54) METHODS OF LOW TEMPERATURE OXIDATION

(75) Inventors: Shih-Ping Hong, Taichung (TW); Han-Hui Hsu, Yongkang (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 12/121,382

(22) Filed: May 15, 2008

(65) Prior Publication Data

US 2009/0286364 A1    Nov. 19, 2009

(51) Int. Cl.
*H01L 21/31* (2006.01)
(52) U.S. Cl. .................. 438/770; 257/E21.192
(58) Field of Classification Search .......... 438/197, 438/770
See application file for complete search history.

(56) References Cited

U.S. PATENT DOCUMENTS

| | | | |
|---|---|---|---|
| 6,712,260 B1 * | 3/2004 | Kuo et al. ............. | 228/180.22 |
| 2004/0238895 A1 * | 12/2004 | Mutou ..................... | 257/368 |
| 2005/0191803 A1 * | 9/2005 | Matsuse et al. ......... | 438/202 |
| 2006/0270236 A1 * | 11/2006 | Kusumoto et al. ...... | 438/692 |
| 2008/0200006 A1 * | 8/2008 | Kim et al. ............... | 438/425 |

\* cited by examiner

*Primary Examiner*—Thao X Le
*Assistant Examiner*—Kimberly Trice
(74) *Attorney, Agent, or Firm*—Townsend and Townsend and Crew LLP

(57) ABSTRACT

A method for forming a dielectric is provided. The method includes providing a substrate having a silicon-containing semiconductor layer within a process chamber. The process chamber is capable of ionizing a process precursor to a plasma comprising an oxygen-containing element and a fluorocarbon-containing element. A surface portion of the silicon-containing material is oxidized by using the plasma to convert the surface portion into an oxidized dielectric material.

19 Claims, 8 Drawing Sheets

METHODS OF LOW TEMPERATURE OXIDATION

BACKGROUND OF THE INVENTION

The present invention is directed to integrated circuits and their processing for the manufacture of semiconductor devices. More particularly, the invention provides a method and device for an oxidized dielectric in a semiconductor device. Merely by way of example, the invention has been applied to low temperature plasma oxidation of silicon for forming a gate dielectric in an MOS device. But it would be recognized that the invention has a much broader range of applicability. For example, the invention can be applied to other silicon devices such as bipolar devices or memory device, e.g. DRAM, Flash memory, MONOS, or other non-volatile memory devices.

Integrated circuits or "ICs" have evolved from a handful of interconnected devices fabricated on a single chip of silicon to millions of devices. In order to achieve improvements in complexity and circuit density, the size of the smallest device feature has become smaller with each generation of ICs. Increasing circuit density has not only improved the complexity and performance of ICs but has also provided lower cost parts to the consumer. On the other hand, making devices smaller is very challenging, as each process used in IC fabrication has a limit. That is to say, a given process typically only works down to a certain feature size, and then either the process or the device layout needs to be changed. An example of such a limit is dielectric films used for the manufacture of integrated circuits in a cost effective and efficient way.

In modern integrated circuit, dielectric films often form important components. For example, thin gate dielectric in an MOS transistor and the tunneling dielectric in a memory device play important roles in device performance and reliability. Thick dielectrics are often used for device isolation, such as in shallow trench isolation or interlayer isolation. Conventionally, thick dielectric films are often formed using chemical vapor deposition (CVD), whereas thin dielectrics are formed by thermal oxidation of silicon. As device dimension becomes smaller, it becomes increasingly difficult to use conventional techniques for forming dielectrics to meet device requirements. These and other limitations are described throughout the present specification and more particularly below.

From the above, it is seen that an improved technique for processing semiconductor devices is desired.

BRIEF SUMMARY OF THE INVENTION

The present invention is directed to semiconductor devices and their manufacture. More particularly, the invention provides a method for forming an oxidized dielectric in a semiconductor device. Merely by way of example, the invention has been applied to low temperature plasma oxidation of silicon for forming a gate dielectric in an MOS device. But it would be recognized that the invention has a much broader range of applicability. For example, the invention can be applied to other silicon devices such as bipolar devices or memory device, e.g. DRAM, Flash memory, MONOS, or other non-volatile memory devices.

According to an embodiment of the present invention, a method for forming a dielectric includes providing a substrate having a silicon-containing semiconductor layer. A surface portion of the silicon-containing material is plasma oxidized to convert the surface portion into an oxidized dielectric material at a process temperature of about 800° C. or less, wherein the plasma oxidization process comprises an oxygen-containing element and a fluorocarbon-containing element. In an embodiment, the plasma process is free from silicon-containing plasma source gases. In a specific embodiment, the substrate is maintained at a temperature in a process temperature range of about 150° C.-550° C. In an embodiment, the flow rate of the fluorocarbon-containing gas is used to control the thickness of the oxidized dielectric.

In a specific embodiment of the method, the plasma process also includes a forming gas ($N_2H_2$). In an example, the forming gas includes a mixture of hydrogen gas and nitrogen gas, with about 2-6% hydrogen gas. In an embodiment, the plasma process is free from silicon-containing plasma source gas, in contrast to conventional plasma CVD oxide process which requires a silicon-containing precursor in the plasma source gas. Depending on the embodiment, the silicon-containing semiconductor layer may include single crystalline silicon, polycrystalline silicon, amorphous silicon, doped silicon, or other silicon-containing semiconductor material. In another example, the silicon-containing semiconductor layer may include a silicon layer or a silicon germanium layer.

In an embodiment of the method, the oxygen-containing gas is selected from the group consisting of $O_2$, $O_3$, NO, and $NO_2$, whereas the fluorocarbon-containing gas is selected from the group consisting of $CF_4$, $CHF_3$, $CH_2F_2$, and $CH_3F$. In a specific embodiment, a thickness associated with the oxidized dielectric can be adjusted by selecting a $CF_4$ flow rate. In an embodiment, the substrate is maintained at a process temperature in the range of about 150° C. to 450° C. In specific embodiment, in the plasma process the substrate is maintained at a temperature of about 250° C. In an embodiment, a plasma process includes a process pressure in a plasma chamber in the range of about 100~10000 mTorr.

A specific process condition for the plasma process includes a process pressure of about 1500 mTorr, an R.F. power of about 2500 W, a process temperature of about 250° C., oxygen gas at a flow rate of about 3000 sccm, a forming gas at a flow rate of about 300 sccm, and a carbon fluorine-containing gas at a flow rate in the range of about 25 sccm. In another specific process, the plasma process includes a process pressure in the range of about 100~10000 mTorr, an R.F. power in the range of about 500~5000 W, and a process temperature of about 150° C.-550° C., oxygen gas at a flow rate in the range of about 300~20000 sccm, a forming gas at a flow rate of about 30~3000 sccm, and a carbon fluorine-containing gas at a flow of about 2 to 100 sccm.

In another embodiment, the present invention provides method for forming a dielectric in a semiconductor device. The method includes providing a semiconductor substrate which includes a surface region. The method includes subjecting the substrate to a plasma process which includes an oxygen-containing gas and a fluorocarbon-containing gas, and causing a top portion of the surface region to be converted into a layer of oxidized dielectric material using a chemical reaction in the plasma process environment. In a specific embodiment, the semiconductor substrate includes a silicon-containing semiconductor layer in the surface region. In an embodiment, the plasma process includes a process pressure in the range of about 100~10000 mTorr, an R.F. power in the range of about 500~5000 W, and a process temperature of about 150° C. to 550° C. The plasma process also includes an oxygen-containing gas at a flow rate in the range of about 300~20000 sccm, a forming gas at a flow rate of about 30~3000 sccm, and a fluorocarbon-containing gas at a flow of about 2 to 100 sccm.

In a specific embodiment, the method for forming a dielectric in a semiconductor device includes providing a silicon substrate which has a surface region. The method includes subjecting the silicon substrate to a plasma process, which includes a process pressure of about 1500 mTorr, an R.F. power of about 2500 W, and a process temperature in the range of about 150° C.~550° C. The plasma process environment also includes oxygen gas at a flow rate of about 3000 sccm, forming gas at a flow rate of about 300 sccm, and $CF_4$ gas at a flow rate in the range of about 25 sccm. The method includes causing a top portion of the silicon substrate to be converted into a layer of oxidized dielectric material using a chemical reaction in the plasma process environment.

According to yet another embodiment of the present invention, a method is provided for forming a dielectric, including providing a substrate having a silicon-containing semiconductor layer, which has a surface region. The method includes subjecting the substrate to a plasma process which includes an oxygen-containing gas and a fluorocarbon-containing gas, and causing a top portion of the silicon-containing semiconductor layer to be converted into a layer of oxidized dielectric material using a chemical reaction in the plasma process environment. In an embodiment, the plasma process is free from silicon-containing plasma source gases. In a specific embodiment, the substrate is maintained at a temperature in a process temperature range of about 150° C.-550° C. In an embodiment, the flow rate of the fluorocarbon-containing gas is used to control the thickness of the oxidized dielectric.

According to an alternative embodiment, the present invention provides a method for forming a semiconductor device. The method includes providing a silicon substrate of a first conductivity type, the substrate including a surface region. The method includes subjecting the substrate to a plasma process, which includes an oxygen-containing gas, a forming gas, and a fluorocarbon-containing gas. The method includes causing a top portion of the silicon substrate to be converted into a layer of oxidized dielectric material using a chemical reaction in the plasma process environment. The method also includes forming a gate structure overlying the dielectric material by depositing and patterning a conductive layer. The method also includes forming a source region and a drain region on either side of the gate structure, respectively. The source region and drain region are formed by converting a first portion and a second portion in the substrate to a second conductivity type.

Many benefits are achieved by way of the present invention over conventional techniques. For example, the present technique provides an easy to use process that relies upon conventional technology. In some embodiments, the method provides a method for low temperature oxidation of a semiconductor material, such as silicon. For example, in a specific embodiment, a method for forming silicon oxide includes oxidizing a silicon substrate in a low temperature plasma process, e.g. at 250° C. or below 250° C. In an embodiment, a method is provided for controlling thickness and achieving desired thickness in the low temperature plasma process. Additionally, the method provides a simple, low temperature, low thermal budget oxidation process that is compatible with conventional process technology without substantial modifications to conventional equipment and processes. These and other benefits will be described in more detail throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention is directed to semiconductor devices and their manufacture. More particularly, the invention provides a method and device for an oxidized dielectric in a semiconductor device. Merely by way of example, the invention has been applied to low temperature plasma oxidation of silicon for forming a gate dielectric in an MOS device. But it would be recognized that the invention has a much broader range of applicability. For example, the invention can be applied to other silicon devices such as bipolar devices or memory device, e.g. DRAM, Flash memory, MONOS, or other non-volatile memory devices.

In modern integrated circuit, thin dielectrics often form important components. For example, the quality of the gate dielectric in an MOS transistor or the tunneling dielectric in a memory device plays an important role in device performance and reliability. These dielectrics are often formed by thermal oxidation of silicon. As integrated circuits continue to be miniaturized, it is desirable to reduce the thermal budget of the process flow. Reducing the thermal budget, such as using a thermal oxidation process at a low temperature, often does not produce the required thickness. Alternatively dielectric formation techniques, such as chemical vapor deposition (CVD) or plasma enhanced chemical vapor deposition (PECVD), may offer lower thermal budget, but often produce lower quality dielectrics. In a typical CVD or PECVD process, a silicon-containing precursor and an oxygen-containing precursor react to form silicon oxide which is deposited on the surface of the silicon substrate. In such a process, the quality of the silicon oxide film and the interface between the deposition silicon oxide and the silicon substrate often do not meet the requirement for a transistor or a memory device.

Accordingly there is need for a low-temperature oxidation process that can achieve the oxide thickness to meet device requirement.

Depending upon the embodiment, the present invention includes various features, which may be used. These features include the following:

1. A method for low temperature oxidation of a semiconductor material, such as silicon;
2. A method for forming silicon oxide by oxidizing a silicon substrate in a low temperature plasma process, e.g. at about 250° C.;
3. A method for controlling thickness and achieving desired thickness in the low temperature plasma process; and
4. A simple, low temperature, low thermal budget oxidation method using a process that is compatible with conventional process technology without substantial modifications to conventional equipment and processes.

As shown, the above features may be in one or more of the embodiments to follow. These features are merely examples, which should not unduly limit the scope of the claims herein. One of ordinary skill in the art would recognize many variations, modifications, and alternatives.

Figure 1:
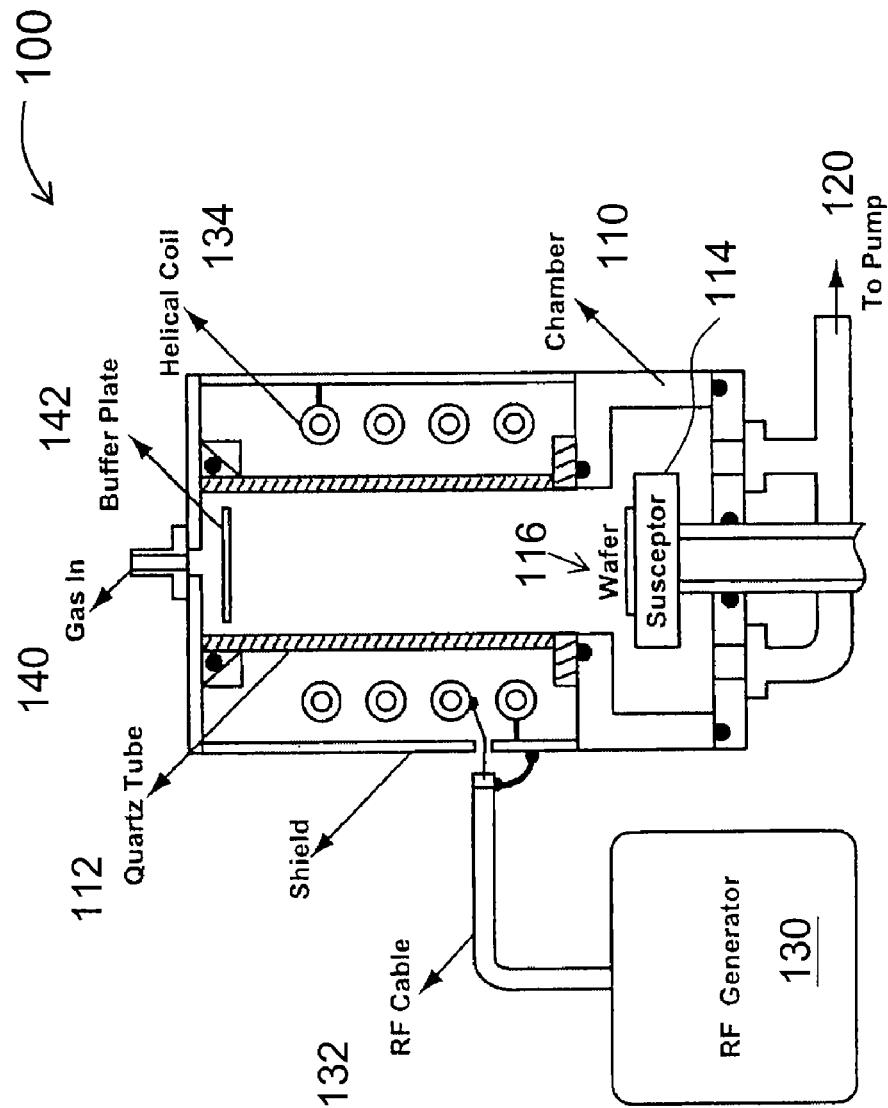
FIG. 1 is a simplified view diagram of a plasma process apparatus for implementing a method for forming an oxidized dielectric according to an embodiment of the present invention.

FIG. 1 is a simplified view diagram of a plasma process apparatus which may be used for implementing a method for forming an oxidized dielectric according to an embodiment of the present invention. This diagram is merely an example, which should not unduly limit the scope of the claims herein. One of ordinary skill in the art would recognize other variations, modifications, and alternatives. As shown, plasma process apparatus 100 includes a process chamber 110, connections to a vacuum pump 120 for maintaining a process pressure, and a gas inlet 140 for receiving plasma source gases. Process chamber 110 also includes a quartz tube 112, in which a wafer 116 can be disposed on a susceptor 114. A heating mechanism (not shown) is connected to the suspector for maintaining the wafer at a desired process temperature. An RF generator 130 supplies electrical power through RF cable 132 to the helical coils 134 for generating plasma inside the quartz tube. A buffer plate 142 is disposed adjacent to the gas inlet 140 to create a uniform flow of plasma source gases.

Although the above has been shown using a selected group of components for the plasma process apparatus 100, there can be many alternatives, modifications, and variations. For example, some of the components may be expanded and/or combined. Other components may be inserted to those noted above. Depending upon the embodiment, the arrangement of components may be interchanged with others replaced. Depending on the process condition, plasma process apparatus 100 can generate reactive ions, charged and energetic particles, and may be used for plasma etching or plasma-assisted deposition. Generally, a plasma process can be specified by the process gas composition, gas flow, process pressure, RF power, and temperature, etc.

According to a specific embodiment of the present invention, a method is provided for forming silicon oxide by performing a low temperature silicon oxidation in the plasma process apparatus 100 discussed above. Further details of the method are found throughout the present specification and more particularly below.

Figure 2:
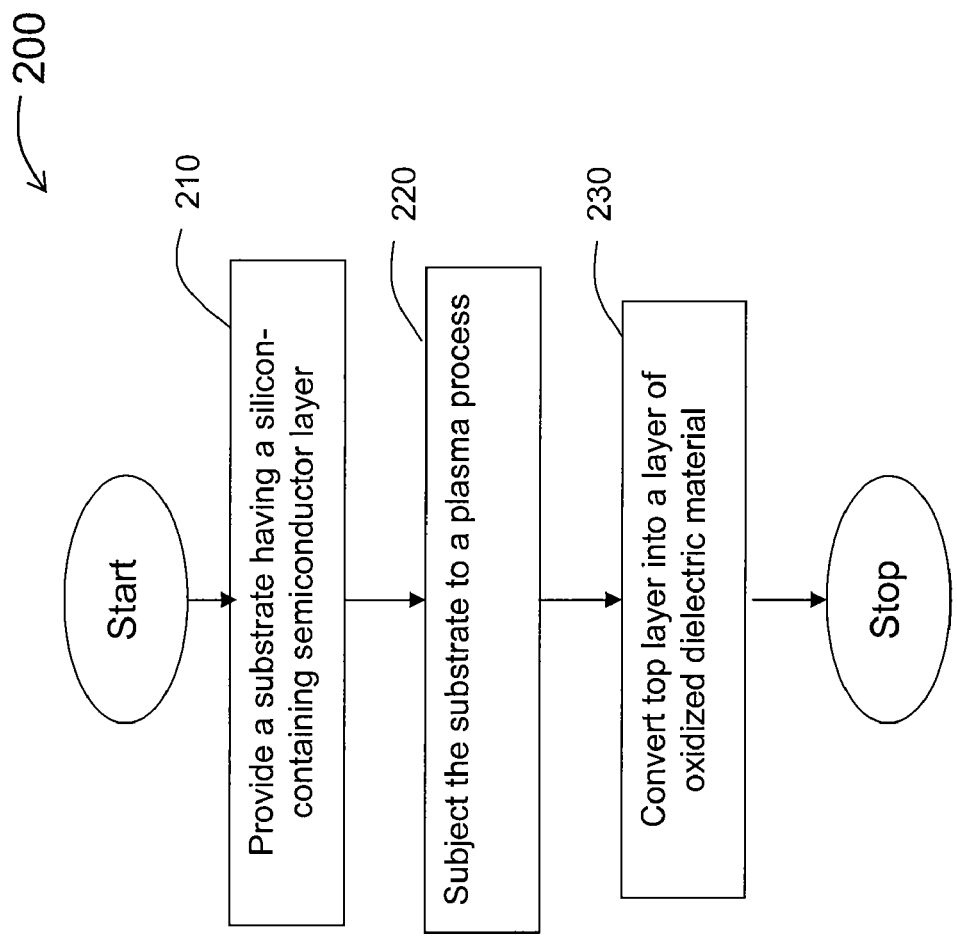
FIG. 2 is a simplified flow diagram of a method for forming an oxidized dielectric according to an embodiment of the present invention.

FIG. 2 is a simplified flow diagram of a method for forming an oxidized dielectric according to an embodiment of the present invention. This diagram is merely an example, which should not unduly limit the scope of the claims herein. One of ordinary skill in the art would recognize other variations, modifications, and alternatives. As shown, the method for an oxidized dielectric according to an embodiment of the present invention can be briefly outlined below.

1. (Process 210) Provide a substrate having a silicon-containing semiconductor layer;
2. (Process 220) Subject the substrate to a plasma process, the plasma process including an oxygen-containing gas and a fluorocarbon-containing gas; and
3. (Process 230) Cause a top portion of the silicon-containing semiconductor layer to be converted into a layer of oxidized dielectric material.

The above sequence of processes provides a low temperature method for oxidizing a silicon substrate according to an embodiment of the present invention. As shown, the method uses a combination of steps including a way of introducing an oxygen-containing gas and a fluorocarbon-containing gas into a plasma process to oxidize a silicon substrate. Further details of the present method can be found throughout the present specification and more particularly below.

Figure 3A:
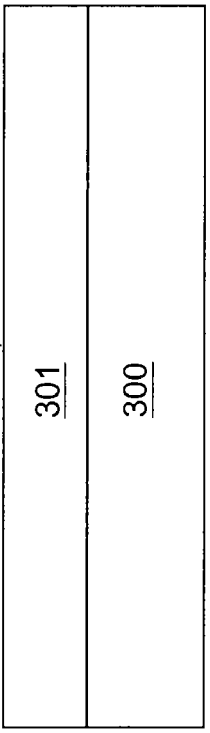
FIGS. 3A-3C are simplified diagrams illustrating a method for forming an oxidized dielectric according to an embodiment of the present invention.
Figure 3B:
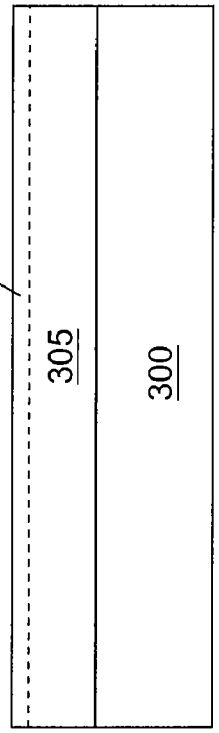
Figure 3C:
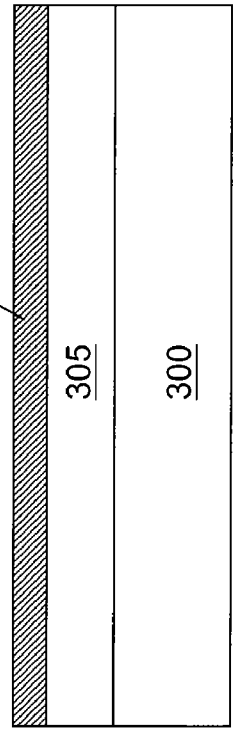

FIGS. 3A through 3C are simplified cross-sectional view diagrams illustrating a method for forming an oxidized dielectric according to embodiments of the present invention. These diagrams are merely an example, which should not unduly limit the scope of the claims herein. One of ordinary skill in the art would recognize other variations, modifications, and alternatives. The processes illustrated in the flow diagram in FIG. 2 are now discussed with reference to the cross-sectional view diagrams in FIGS. 3A-3C. As shown, the method for forming an oxidized dielectric at low temperature begins at start, process 201. In Process 210, a substrate is provided. As shown in FIG. 3A, substrate 300 includes a silicon-containing semiconductor layer 301 which has a surface region 302. In an embodiment, the silicon-containing layer 301 may be single crystalline silicon, polycrystalline silicon, amorphous silicon, silicon nitride (SiN), silicon germanium (SiGe), or silicon oxynitride (SiON). In some embodiments, the silicon-containing layer may include a silicon-germanium layer. The silicon-containing layer may be doped or undoped. For example, the silicon contain layer may be a top layer of a silicon, polysilicon, or amorphous silicon substrate. In another example, the silicon-containing layer may be the silicon device layer in an SOI structure or a polysilicon interconnect layer.

In process 220, the method includes subjecting the substrate to a plasma process. In an embodiment, the plasma process includes an oxygen-containing gas and a fluorocarbon-containing gas. In a specific embodiment, plasma process also includes forming gas, which is a mixture of hydrogen gas and nitrogen gas with the hydrogen gas accounting for about 2-6% of the forming gas. In an embodiment, the oxygen-containing gas includes one or more of $O_2$, $O_3$, NO, $H_2O$, and $NO_2$. In some embodiments, the fluorocarbon-containing gas includes one or more of $CF_4$, $CHF_3$, $CH_2F_2$, and $CH_3F$.

In some embodiments, during the plasma process the substrate is maintained at a process temperature in the range of about 150° C. to 550° C. In a specific embodiment, oxidizing the silicon substrate can be achieved while maintaining the substrate at a temperature of about 250° C. In alternative embodiment, the substrate is maintained at a temperature below 800° C. The plasma process can be carried out in a relative wide range of process pressure. For example, in certain embodiments, process pressure in a plasma chamber is maintained at a process in the range of 100 to 100000 mTorr. In a specific embodiment, the process pressure is maintained at approximately 1500 mTorr.

In some embodiments, the plasma process condition includes a process pressure in the range of about 100~10000 mTorr, an R.F. power in the range of about 500~5000 W, and a process temperature of about 150° C. to 550° C., the plasma process environment including oxygen gas at a flow rate in the range of about 300~20000 sccm, a forming gas at a flow rate of about 30~3000 sccm, a carbon fluorine-containing gas at a flow of about 2 to 100 sccm. In a specific embodiment, the plasma process is conducted using a process pressure of about 1500 mTorr, a power of about 2500 W, and a process temperature in the range of about 250° C., the plasma process environment including oxygen gas at a flow rate of about 3000 sccm, a forming gas at a flow rate of about 300 sccm, a carbon fluorine-containing gas at a flow rate in the range of about 25 sccm. In some examples of the above processes, oxygen gas and $CF_4$ gas are used. Of course, there can be many variations, modifications, and alternatives. In some embodiments, the process temperature may be selected in a range of about 150° C. to 450° C.

In FIG. 3B, the plasma process causes a top portion 306 of the silicon-containing semiconductor layer to be converted into a layer of oxidized dielectric material in the plasma process (In process 230). According to an embodiment, the invention provides a method for forming oxide in a plasma process which is free from silicon-containing plasma source gas. The method provides oxidizing specifies in the plasma to oxidize the top portion 306 of the silicon-containing semiconductor layer in the substrate. In FIG. 3C, an oxide layer 307 is formed overlying the unoxidized silicon-containing layer 305. This is different from a conventional chemical vapor deposition (CVD) of oxide in which both silicon-containing species and oxygen-containing species are provided in a plasma environment to form silicon oxide that is deposited on the surface of the substrate.

The above sequence of processes provides a low temperature method for oxidizing a silicon substrate according to an embodiment of the present invention. As shown, the method uses a combination of steps including a way of introducing an oxygen-containing gas and a fluorocarbon-containing gas into a plasma process to oxidize a silicon substrate. Other alternatives can also be provided where processes are added, one or more processes are removed, or one or more processes are provided in a different sequence without departing from the scope of the claims herein. Further details of the present method can be found throughout the present specification and more particularly below.

According to embodiments of the present invention, silicon oxide can be obtained by oxidizing a silicon substrate at low temperature in a plasma process, and the oxide growth can be varied by selecting process conditions, such as process gas composition, gas flow rate, temperature, pressure, oxidation time, etc. In order to demonstrate the methods provided in the present invention, we have conducted experimental studies to investigate low temperature plasma oxide growth on silicon substrate. In these studies, we have examined oxide growth as functions of oxidation time, plasma gas sources, and gas flow rate, etc. Some of the results are presented below.

Figure 4:
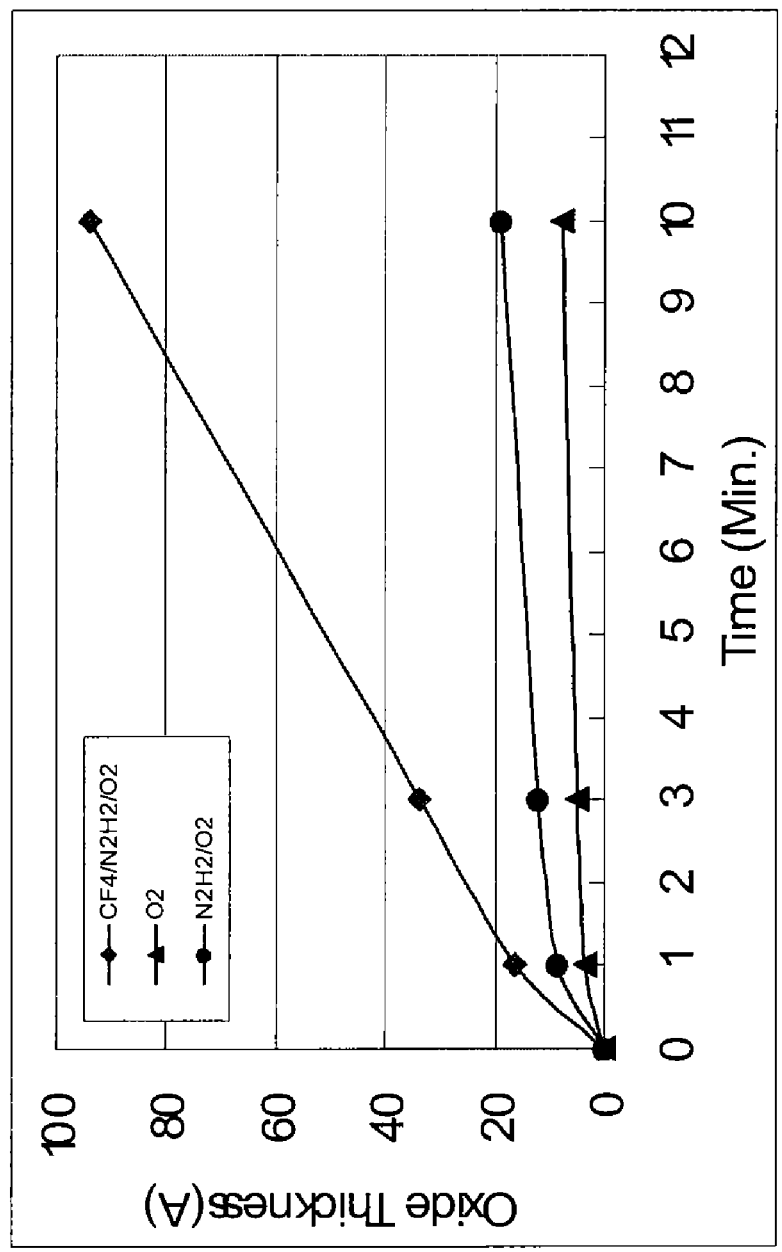
FIG. 4 is a simplified diagram illustrating oxide growth as a function of process gas and process time according to an embodiment of the present invention.

FIG. 4 is a simplified diagram illustrating oxide growth as a function of process gas and process time according to an embodiment of the present invention. This diagram is merely an example, which should not unduly limit the scope of the claims herein. One of ordinary skill in the art would recognize other variations, modifications, and alternatives. As shown, the thickness of oxide formed on a silicon substrate under three different process conditions are plotted as functions of time. It is noted that process pressure (1500 mTorr), R.F. power (2500 W), $O_2$ gas flow (3000 sccm), and temperature (250° C.) are held constant in all three processes, whereas different process gas compositions are used in each process. These three processes are listed below, including $O_2$ gas flow, forming gas (designated as $N_2H_2$) flow, $CF_4$ (tetrafluoromethane) gas flow, and temperature. The gas flow rates are shown in sccm.

| 1. $CF_4/N_2H_2/O_2$: | /3000 $O_2$/300 $N_2H_2$/15 $CF_4$/ |
|---|---|
| 2. $N_2H_2/O_2$: | /3000 $O_2$/300 $N_2H_2$/0 $CF_4$/ |
| 3. $O_2$: | /3000 $O_2$/0 $N_2H_2$/0 $CF_4$/ |

It can be seen that process 3 included only $O_2$ gas and produced the least oxide growth, with about 10 Å of oxide after 10 min of oxidation. Process 2, including $O_2$ gas at a flow rate of 3000 sccm and $N_2H_2$ at 300 sccm produced thicker oxide, at about 20 Å after 10 min. In comparison, Process 1, including $CF_4$ at a flow rate of 15 sccm, $N_2H_2$ at 300 sccm, and $O_2$ gas, produced substantially thicker oxide, at about 95 Å after 10 min of oxidation. Thus according to a specific embodiment of the invention, in low temperature plasma oxidation, the plasma gas composition can be used to control oxide growth. According to our experimental data, the flow rate of the fluorocarbon-containing gas appears to significantly affect the growth rate of the oxidized dielectric. In particular, increasing CF4 flow substantially enhances the growth of the oxidized dielectric.

Figure 5:
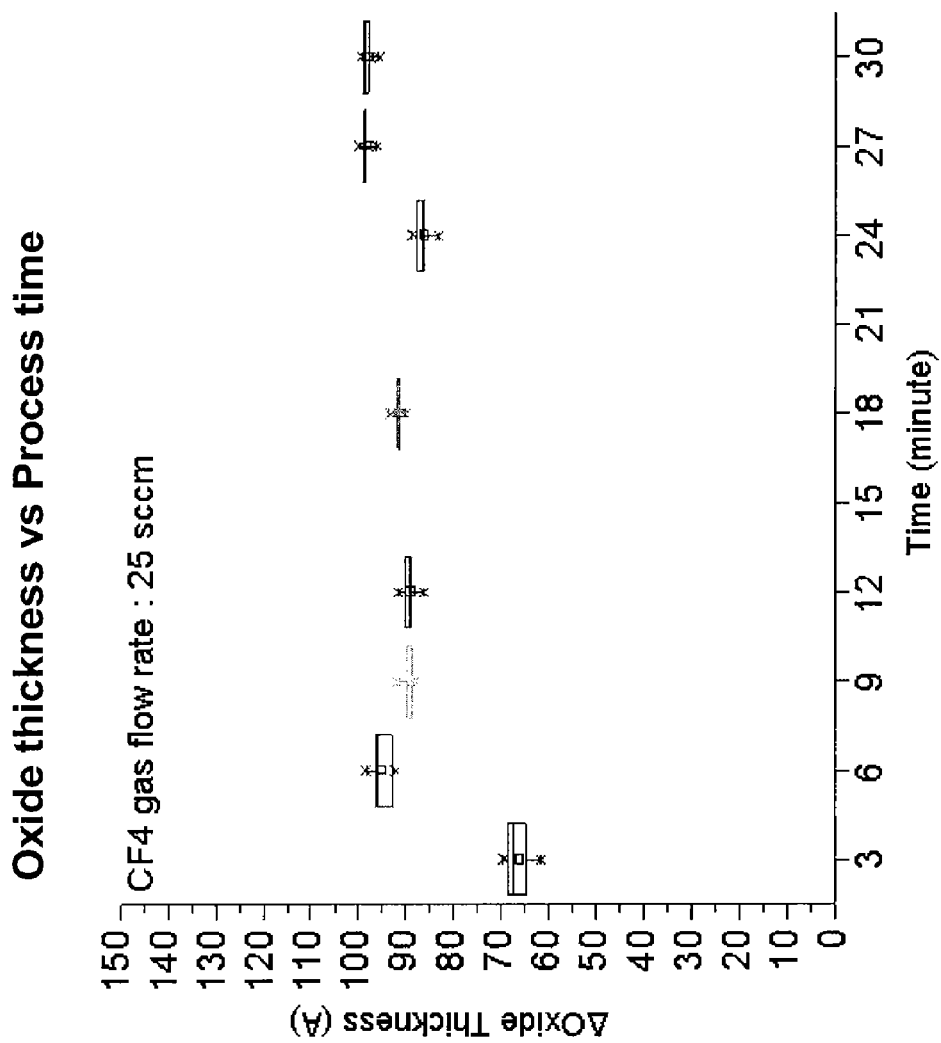
FIG. 5 is a simplified diagram illustrating oxide growth using $CF_4$ gas as a function of time according to an embodiment of the present invention.

FIG. 5 is a simplified diagram illustrating oxide growth using $CF_4$ gas as a function of time according to an embodiment of the present invention. This diagram is merely an example, which should not unduly limit the scope of the claims herein. One of ordinary skill in the art would recognize other variations, modifications, and alternatives. As shown FIG. 5 plots oxide thickness as a function of oxidation time using a $CF_4$ flow rate of 25 sccm. The other process conditions are process pressure (1500 mTorr), R.F. power (2500 W), $O_2$ gas flow (3000 sccm), forming gas flow (300 sccm), and temperature (250° C.). It can be seen that at a $CF_4$ flow rate of 25 sccm, the oxide growth reaches a thickness of about 90-100 Å in about six minutes and does not increase substantially with longer process time.

Figure 6:
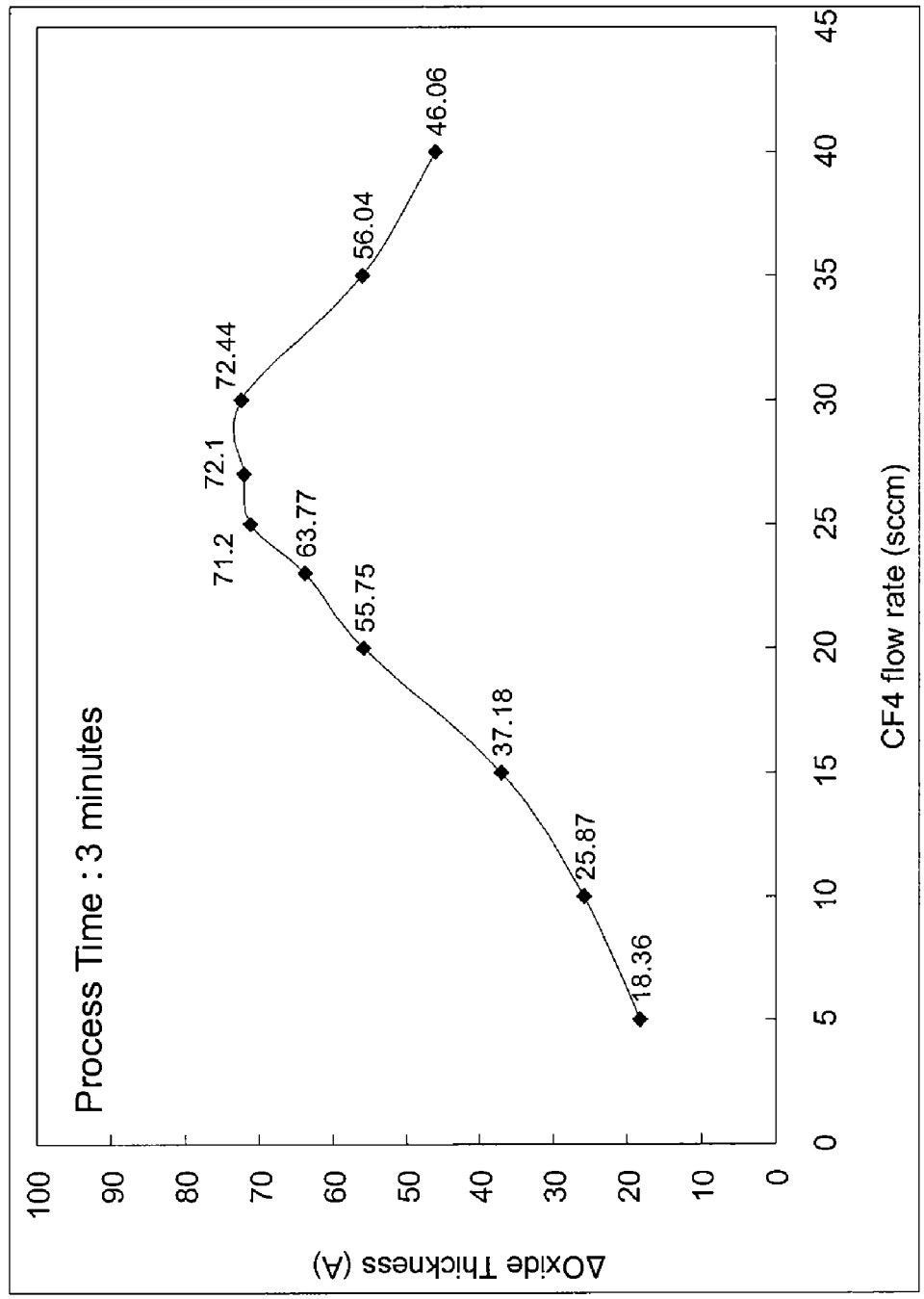
FIG. 6 is a simplified diagram illustrating oxide growth as a function of $CF_4$ gas flow rate according to an embodiment of the present invention.

FIG. 6 is a simplified diagram illustrating oxide growth as a function of $CF_4$ gas flow rate according to an embodiment of the present invention. This diagram is merely an example, which should not unduly limit the scope of the claims herein. One of ordinary skill in the art would recognize other variations, modifications, and alternatives. As shown, the oxide thickness increases with higher $CF_4$ flow rate up to about 25 sccm. At flow rate higher than 25 sccm, the oxide growth appears to decrease with increased flow.

Figure 7:
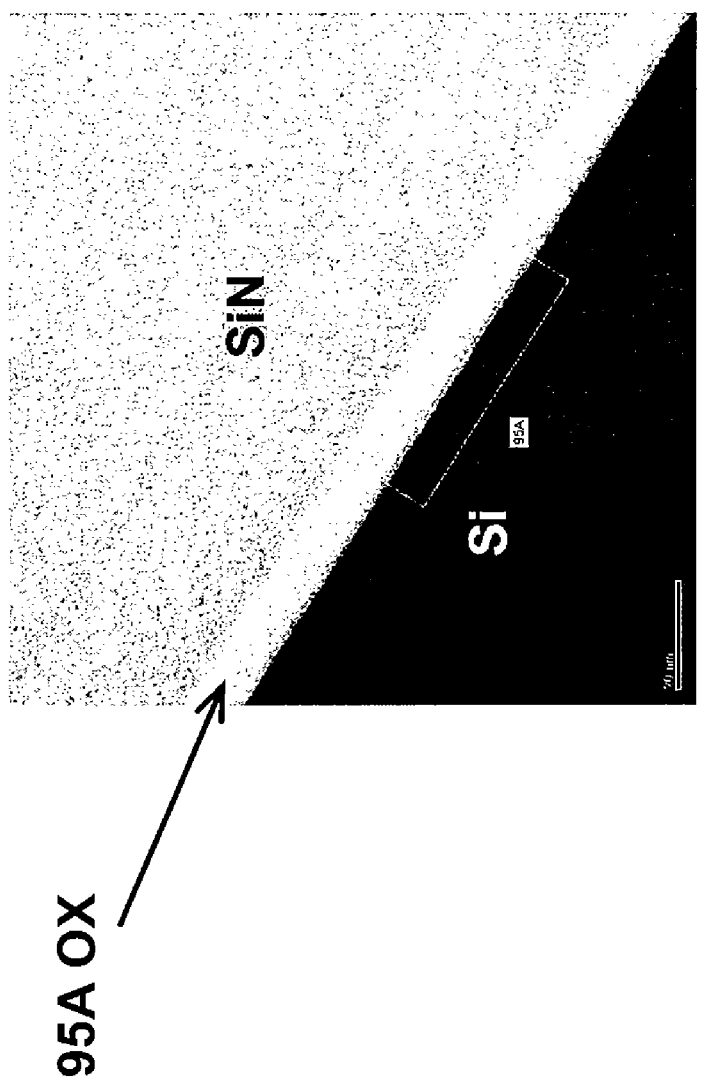
FIG. 7 is a transmission electron microscope (TEM) micrograph illustrating an oxide layer formed using a low temperature plasma oxidation process according to an embodiment of the present invention.

FIG. 7 is a transmission electron microscope (TEM) micrograph illustrating an oxide layer formed in a low temperature plasma oxidation process according to an embodiment of the present invention. This diagram is merely an example, which should not unduly limit the scope of the claims herein. One of ordinary skill in the art would recognize other variations, modifications, and alternatives. As shown, FIG. 7 is a cross-sectional SEM micrograph showing uniform oxide of about 95 Å form on the silicon substrate with a process condition of process pressure (1500 mTorr), R.F. power (2500 W), $O_2$ gas flow (3000 sccm), temperature (250° C.), $O_2$ gas at a flow rate of 3000 sccm, forming gas at 300 sccm, and $CF_4$ at a flow rate of 15 sccm.

Figure 8A:
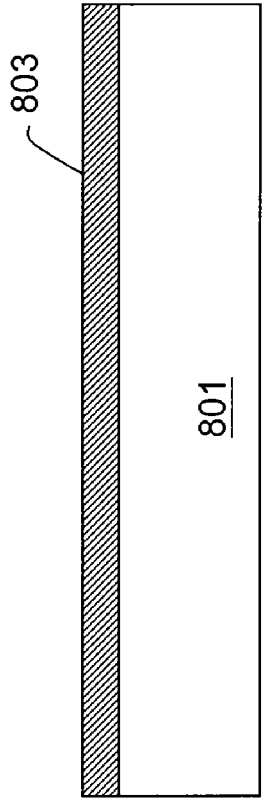
FIGS. 8A-8C are simplified cross-sectional diagrams illustrating a method for forming a semiconductor device according to an embodiment of the present invention.
Figure 8B:
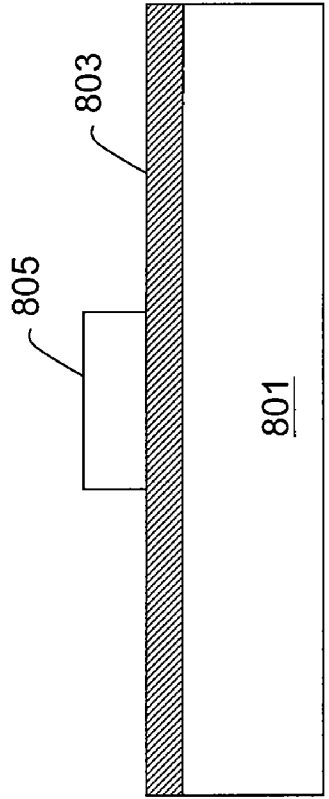
Figure 8C:
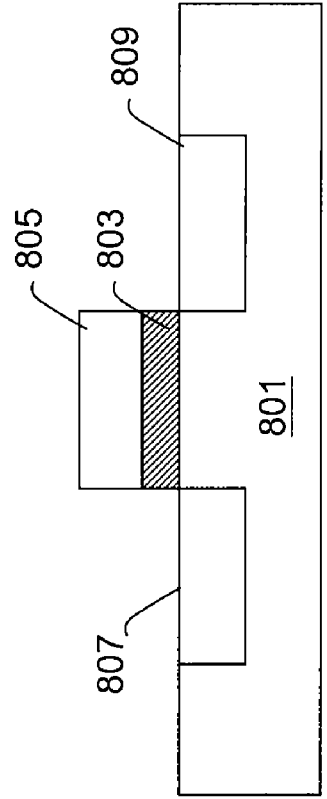

FIGS. 8A-8C are simplified diagrams illustrating a method for forming a semiconductor device according to an embodiment of the present invention. These diagrams are merely examples, which should not unduly limit the scope of the claims herein. One of ordinary skill in the art would recognize other variations, modifications, and alternatives. As shown in FIG. 8A, the method includes providing a silicon substrate 801, which includes a surface region not shown. In a specific example, the substrate may have an N-type conductivity. Of course it is recognized that the method applies to a P-type substrate as well. As shown, a gate oxide 803 layer is formed. In an embodiment, gate oxide layer 803 may be formed by a process described above in conjunction with FIGS. 3A-3C. For example, the substrate is subject to a plasma process, which includes an oxygen-containing gas, a forming gas, and a fluorocarbon-containing gas. The plasma process causing a top portion of the surface region to be converted into a layer of oxidized dielectric material 803 using a chemical reaction in the plasma process environment.

In FIG. 8B, a gate structure 805 is formed overlying the dielectric material 803 by depositing and patterning a conductive layer. In an example, gate structure may be a doped polysilicon gate formed using deposition and patterning techniques. In FIG. 8C, regions 807 and 809 in the substrate are converted to a second conductivity type, for example P-type, to form a source region and a drain region. As shown, the source region 807 and drain region 809 are located on either side of the gate structure, respectively. In a specific embodiment, the source and drain regions may be formed using an ion implantation process.

Many benefits are achieved by way of the present invention over conventional techniques. For example, the present technique provides an easy to use process that relies upon conventional technology. In some embodiments, the method provides a method for low temperature oxidation of a semiconductor material, such as silicon. For example, in a specific embodiment, a method for forming silicon oxide includes oxidizing a silicon substrate in a low temperature plasma process, e.g. at 250° C. or below 250° C. In an embodiment, a method is provided for controlling thickness and achieving desired thickness in the low temperature plasma process. Additionally, the method provides a simple, low temperature, low thermal budget oxidation process that is compatible with conventional process technology without substantial modifications to conventional equipment and processes.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

What is claimed is:

1. A method for forming a dielectric, the method comprising:
providing a substrate having a silicon-containing material within a process chamber, wherein the process chamber is capable of ionizing a process precursor to a plasma comprising an oxygen-containing element, a fluorocarbon-containing element, and an element ionized from N2H2; and oxidizing a surface portion of the silicon-containing material by using the plasma produced by the oxygen-containing element, the fluorocarbon-containing element, and $N_2H_2$ to convert the surface portion into an oxidized dielectric material.

2. The method of claim 1 wherein the silicon-containing material comprises a material selected from the group consisting of single crystalline silicon, polycrystalline silicon, amorphous silicon, silicon nitride (SiN), silicon germanium, and silicon oxynitride (SiON).

3. The method of claim 1 wherein in the oxygen-containing element is generated from a gas, wherein the gas is selected from the group consisting of $O_2$, $O_3$, NO, H2O, and $NO_2$.

4. The method of claim 1 wherein the fluorocarbon-containing element is generated from a gas, wherein the gas is selected from the group consisting of $CF_4$, $CHF_3$, $CH_2F_2$, and $CH_3F$.

5. The method of claim 1 further comprising adjusting a thickness associated with the oxidized dielectric by selecting a $CF_4$ flow rate.

6. The method of claim 1 wherein the plasma oxidation process comprises a process pressure in the range of about 100~10,000 mTorr, an R.F. power in the range of about 500~5,000 W, oxygen gas at a flow rate in the range of about 300~20,000 sccm, a forming gas at a flow rate of about 30~3,000 sccm, and a carbon and fluorine-containing gas at a flow of about 2 to 100 sccm.

7. The method of claim 1 wherein the plasma oxidation process comprises a process pressure of about 1,500 mTorr, an R. F. power of about 2,500 W, an oxygen gas at a flow rate of about 3,000 sccm, a forming gas at a flow rate of about 300 sccm, and a carbon and fluorine-containing gas at a flow rate of about 25 sccm.

8. The method of claim 1 wherein the oxidizing the surface portion of the silicon-containing material has a process temperature between about 800° C. or less.

9. A method for forming a dielectric in a semiconductor device, the method comprising:
providing a semiconductor substrate, semiconductor substrate including a surface region; and
plasma oxidizing a portion of the surface region of the semiconductor substrate to convert the portion of the surface region of the semiconductor into an oxidized dielectric material, the plasma oxidation process including an oxygen-containing gas, an $N_2H_2$-containing gas, and a fluorocarbon-containing gas, the plasma oxidation process being free from a silicon-containing plasma source gas.

10. The method of claim 9 wherein the semiconductor substrate comprises a silicon-containing semiconductor layer at the surface region.

11. The method of claim 10 wherein the silicon-containing semiconductor layer comprises a silicon layer or a silicon germanium layer.

12. The method of claim 9 further comprising adjusting a thickness associated with the oxidized dielectric by selecting a flow rate for the fluorocarbon-containing gas.

13. The method of claim 9 wherein plasma oxidizing the semiconductor substrate comprises maintaining the semiconductor substrate at a temperature of about 250° C.

14. The method of claim 9 wherein in oxygen-containing gas is selected from the group consisting of $O_2$, $O_3$, NO, and $NO_2$.

15. The method of claim 9 wherein the fluorocarbon-containing gas is selected from the group consisting of $CF_4$, $CHF_3$, $CH_2F_2$, and $CH_3F$.

16. The method of claim 9 wherein the plasma oxidation process comprises a process pressure in the range of about 100~10,000 mTorr, an R.F. power in the range of about 500~5,000 W, and a process temperature of about 150° C.-550° C., the plasma process environment including oxygen gas at a flow rate in the range of about 300~20,000 sccm, a forming gas at a flow rate of about 30~3,000 sccm, and a carbon and fluorine-containing gas at a flow rate between about 2 sccm and about 100 sccm.

17. A method for forming a semiconductor device, the method comprising:

providing a silicon substrate, the substrate including a surface region, the substrate being characterized by a first conductivity type;

plasma oxidizing a surface portion of the substrate to convert the surface portion of the substrate into a layer of oxidized dielectric material, the plasma oxidation process including an oxygen-containing gas, a forming gas including $N_2H_2$, and a fluorocarbon-containing gas, the plasma oxidation process being free from silicon-containing plasma source gas; and forming a gate structure overlying the oxidized dielectric material by depositing and patterning a conductive layer;

converting a first portion and a second portion in the substrate to a second conductivity type to form a source region and a drain region, respectively, the first portion and the second portion being on either side of the gate structure.

18. The method of claim 17 wherein plasma oxidizing the surface portion comprises maintaining the substrate at a temperature of about 250° C.

19. The method of claim 17 further comprising adjusting a thickness associated with the oxidized dielectric by selecting a flow rate for the fluorocarbon-containing gas.

* * * * *